US011561327B2

(12) United States Patent
Underwood

(10) Patent No.: US 11,561,327 B2
(45) Date of Patent: Jan. 24, 2023

(54) REAL-TIME LIGHTNING MONITOR FOR SYNTHETIC VISION SYSTEMS (SVS)

(71) Applicant: Rockwell Collins, Inc., Cedar Rapids, IA (US)

(72) Inventor: Darin M. Underwood, Cedar Rapids, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 616 days.

(21) Appl. No.: 16/691,261

(22) Filed: Nov. 21, 2019

(65) Prior Publication Data

US 2021/0157030 A1 May 27, 2021

(51) Int. Cl.
| | |
|---|---|
| *G01W 1/16* | (2006.01) |
| *B64D 45/02* | (2006.01) |
| *G01R 29/08* | (2006.01) |
| *G01S 7/04* | (2006.01) |
| *G01S 13/95* | (2006.01) |
| *G02B 27/01* | (2006.01) |

(52) U.S. Cl.
CPC .............. *G01W 1/16* (2013.01); *B64D 45/02* (2013.01); *G01R 29/0842* (2013.01); *G01S 7/04* (2013.01); *G01S 13/953* (2013.01); *G02B 27/01* (2013.01)

(58) Field of Classification Search
CPC ......... G01W 1/16; B64D 45/02; B64D 43/00; G01R 29/0842; G01S 7/04; G01S 13/953; G02B 27/01; G01C 23/00
See application file for complete search history.

(56) References Cited

U.S. PATENT DOCUMENTS

| | | | |
|---|---|---|---|
| 4,506,211 | A | 3/1985 | Coleman |
| 5,295,071 | A | 3/1994 | Kuzma et al. |
| 5,299,127 | A | 3/1994 | Stevens, Jr. et al. |
| 5,305,210 | A | 4/1994 | Kuzma et al. |
| 5,319,553 | A | 6/1994 | Gregg et al. |

(Continued)

FOREIGN PATENT DOCUMENTS

EP 0693696 A2 1/1996

OTHER PUBLICATIONS

Extended Search Report for European Application No. 20209246.6 dated Apr. 4, 2021, 11 pages.

*Primary Examiner* — Raul J Rios Russo
(74) *Attorney, Agent, or Firm* — Suiter Swantz pc llo

(57) ABSTRACT

An aircraft-based synthetic vision system (SVS) is disclosed. In embodiments, the SVS includes avionics processors in communication with onboard lightning detection sensors, which provide the SVS with real-time lightning data (e.g., bearing to, and distance from, the aircraft) about proximate lightning strikes. Based on the real-time lightning data, the avionics processors generate flight deck effects (FDE) corresponding to identified areas of lightning activity (e.g., a sufficient quantity of strikes, exceeding a strike threshold, within a particular airspace during a time window), each FDE having a particular bearing to and distance from the aircraft. The FDE data is processed by a display system aboard the aircraft (e.g., a cockpit-based primary flight display (PFD) or head-worn/heads-up display (HWD/HUD)) which incorporates the generated FDEs into the SVS status display provided to the flight crew or pilot at the appropriate bearing and distance relative to the aircraft.

12 Claims, 4 Drawing Sheets

(56) References Cited

U.S. PATENT DOCUMENTS

| | | |
|---|---|---|
| 5,325,299 A | 6/1994 | Moses et al. |
| 5,331,330 A | 7/1994 | Susnjara |
| 5,610,813 A | 3/1997 | Greenewald et al. |
| 6,215,294 B1 | 4/2001 | Coleman |
| 6,246,367 B1 | 6/2001 | Markson et al. |
| 6,606,564 B2 | 8/2003 | Schwinn et al. |
| 7,868,811 B1 | 1/2011 | Woodell et al. |
| 8,010,289 B1 | 8/2011 | Ryan et al. |
| 8,244,418 B1 | 8/2012 | Frank et al. |
| 8,477,062 B1 | 7/2013 | Kanellis |
| 8,902,100 B1 | 12/2014 | Woodell et al. |
| 9,134,418 B1 | 9/2015 | Kronfeld et al. |
| 10,156,659 B2 | 12/2018 | Candor |
| 10,302,815 B1 | 5/2019 | Kronfeld et al. |
| 2002/0075170 A1* | 6/2002 | Schwinn ............... G06F 3/0481 340/945 |
| 2002/0133295 A1* | 9/2002 | Schwinn ............... G06F 3/0481 702/4 |
| 2002/0163446 A1 | 11/2002 | Schwinn et al. |
| 2009/0164124 A1 | 6/2009 | Ryan et al. |
| 2017/0082745 A1* | 3/2017 | Kronfeld ............... G01S 13/953 |
| 2018/0238708 A1* | 8/2018 | He ........................ B64D 45/08 |
| 2020/0051442 A1* | 2/2020 | S. ........................... G01C 23/00 |
| 2022/0321807 A1* | 10/2022 | Lajiness ................ H04N 5/235 |

\* cited by examiner

REAL-TIME LIGHTNING MONITOR FOR SYNTHETIC VISION SYSTEMS (SVS)

TECHNICAL FIELD

Embodiments of the inventive concepts disclosed herein are directed generally to aircraft-based synthetic vision systems (SVS), and more particularly to synthetic vision systems capable of processing and displaying weather data.

BACKGROUND

Modern primary flight displays (PFD) may provide a limited amount of weather information to the cockpit crew via synthetic vision systems (SVS) that also provides visual information about terrain, landmarks, and obstacles near the aircraft. However, onboard weather radar (WXR) may only provide information about precipitation (e.g., rain and hail) and precipitation-related turbulence, but no information about nearby lightning strikes. In some cases, the aircraft itself may trigger a lightning strike if flying through particularly charged cloud cover. While commercial aircraft may incorporate extensive safeguards to protect passengers and aircraft fuel systems from lightning, the associated power surges may still result in damage to the aircraft or to its extensive electrical systems. Similarly, while some onboard systems may display atmospheric data with respect to predicting wind shear conditions, these systems may operate only during certain flight segments or altitudes (e.g., landing/initial climb, final descent/takeoff).

SUMMARY

An aircraft-based synthetic vision system (SVS) is disclosed. In embodiments, the SVS includes avionics processors linked to aircraft lightning sensors. The lightning sensors detect lightning strikes proximate to the aircraft and generate real-time data for each strike, including a bearing and distance from the aircraft to the strike. Based on the real-time lightning data, the avionics processors generate flight deck effects (FDE) a distance for each volume enclosing a sufficient quantity of proximate lightning strikes occurring during a time window (e.g., during the last minute). The FDEs are sent to aircraft display systems, which incorporate into, or superimpose the FDEs on, status displays generated by the display systems (e.g., aircraft position, instrument statuses), such that the FDEs display the relative position of the proximate lightning strikes to pilots and crew.

A real-time lightning detection system is also disclosed. In embodiments, the real-time lightning detection system includes aircraft-based lightning sensors for detecting lightning strikes proximate to the aircraft (e.g., within a predetermined distance). For each proximate lightning strike detected, the lightning sensors generate real-time lightning data, e.g., a time of the strike and its bearing and distance from the aircraft. The lightning detection sensors are linked to avionics processors which determine, for each collection of proximate lightning strikes within a particular volume during a time window, a flight deck effect (FDE) corresponding to the volume, as well as a bearing and distance from the aircraft to the volume. The real-time lightning detection system includes aircraft displays (e.g., primary flight displays (PFD), heads-up displays (HUD), and/or head-worn displays (HWD) capable of generating status displays including, e.g., the aircraft position and statuses of its instruments. The avionics processors incorporate the generated FDEs into status displays, such that the FDEs are displayed to pilots and crew in real time or near real time.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
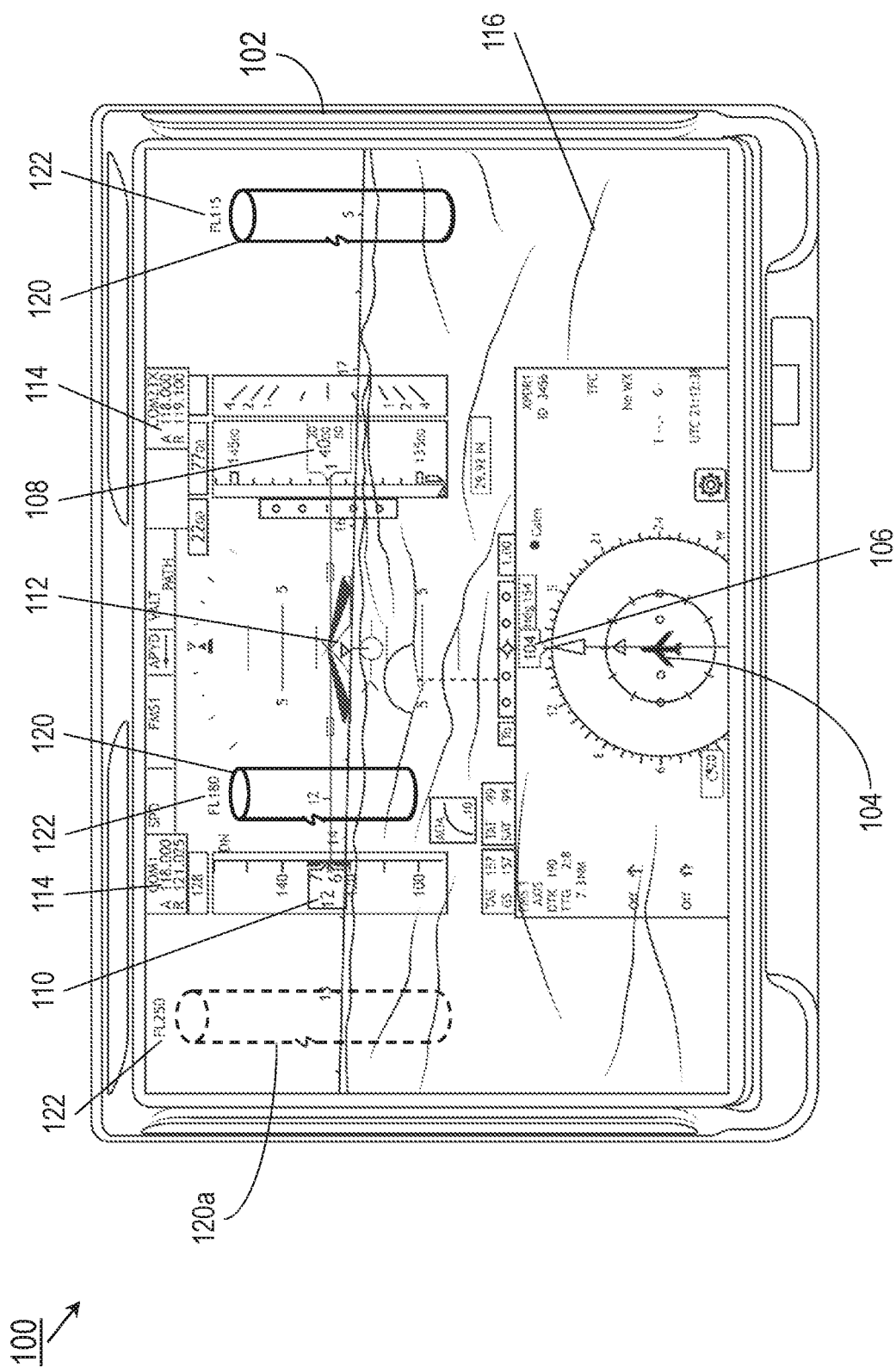
FIG. 1 is a forward illustration of a primary flight display (PFD) in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Referring to FIG. 1, a synthetic vision system display 100 (SVS) is disclosed.

In embodiments, the SVS display 100 may be displayed by a primary flight display 102 (PFD) mounted in an aircraft cockpit. In some embodiments, the SVS display 100 may be displayed by a mobile computing device, e.g., a tablet or similar device wirelessly linked to onboard avionics processors or networks. The SVS display may continually and dynamically indicate status updates combining positional, navigational, or operational data of the aircraft 104 (e.g., heading 106, altitude 108, airspeed 110, attitude 112, communications status 114) with SVS-based or enhanced vision system (EVS) based representations of the surrounding terrain 116. For example, the terrain 116 surrounding the aircraft 104 may be visible or may be obscured (e.g., by darkness or degraded visual environment (DVE)); however, the SVS display 100 may combine positional information (e.g., GNSS satellite-based updates as to the exact longitude, latitude, and altitude of the aircraft) with retrieved information about terrain 116 and landmarks therewithin (e.g., natural features, manmade structures) corresponding to the current position to provide an accurate simulation of the surrounding terrain. In some embodiments, the SVS display 100 may include weather information, e.g., barometric pressure 118 or weather radar (WXR) information, e.g., active areas of precipitation or precipitation related turbulence.

In embodiments, the SVS display 100 may display flight deck effects 120, 120a (FDE) superimposed thereupon or integrated thereinto, the displayed FDE corresponding to identified lightning zones. For example, lightning detection sensors (LDS) aboard the aircraft 104 may identify any individual lightning strikes occurring within a predetermined range of the aircraft. Whenever a sufficient quantity of lightning strikes is detected in close proximity within a defined time history, an FDE 120, 120a may be generated defining a volume including the identified strikes. The FDE 120, 120a may be superimposed on the SVS display 100 at the appropriate bearing to, and distance from, the aircraft 104, such that the positions of the corresponding volumes are shown relative to the current position and heading 106 of the aircraft. In some embodiments, the FDE 120, 120a may include an altitude marker 122 indicating the approximate ceiling of the volume at, e.g., FL (Flight Level) 250, FL 180, or FL 115 (corresponding respectively to 25000, 18000, or 11500 feet).

In embodiments, a given FDE 120a may decay and disappear from the SVS display 100. For example, after one minute (e.g., after initial appearance) the FDE 120a may be displayed in an altered fashion, e.g., via dotted lines or change of color. After two minutes, the FDE 120a may be eliminated entirely. In some embodiments, the FDE 120, 120a may decay and disappear from the SVS display 100 based on deceeding a strike threshold, as described below. In some embodiments, a given FDE 120, 120a may decay and/or disappear if the lightning sensors cease data transmission for any reason or, e.g., if the volume corresponding to the FDE is sufficiently distant to be out of range of the aircraft 104.

In embodiments, while a given FDE 120 remains onscreen, the bearing and distance of the FDE are available for review by the flight crew. For example, by modifying the flight plan to navigate the aircraft 104 around, or away from, airspace corresponding to an FDE 120, the flight crew may enhance passenger comfort and safety while increasing the longevity of the airframe by reducing exposure to lightning strikes.

Figure 2:
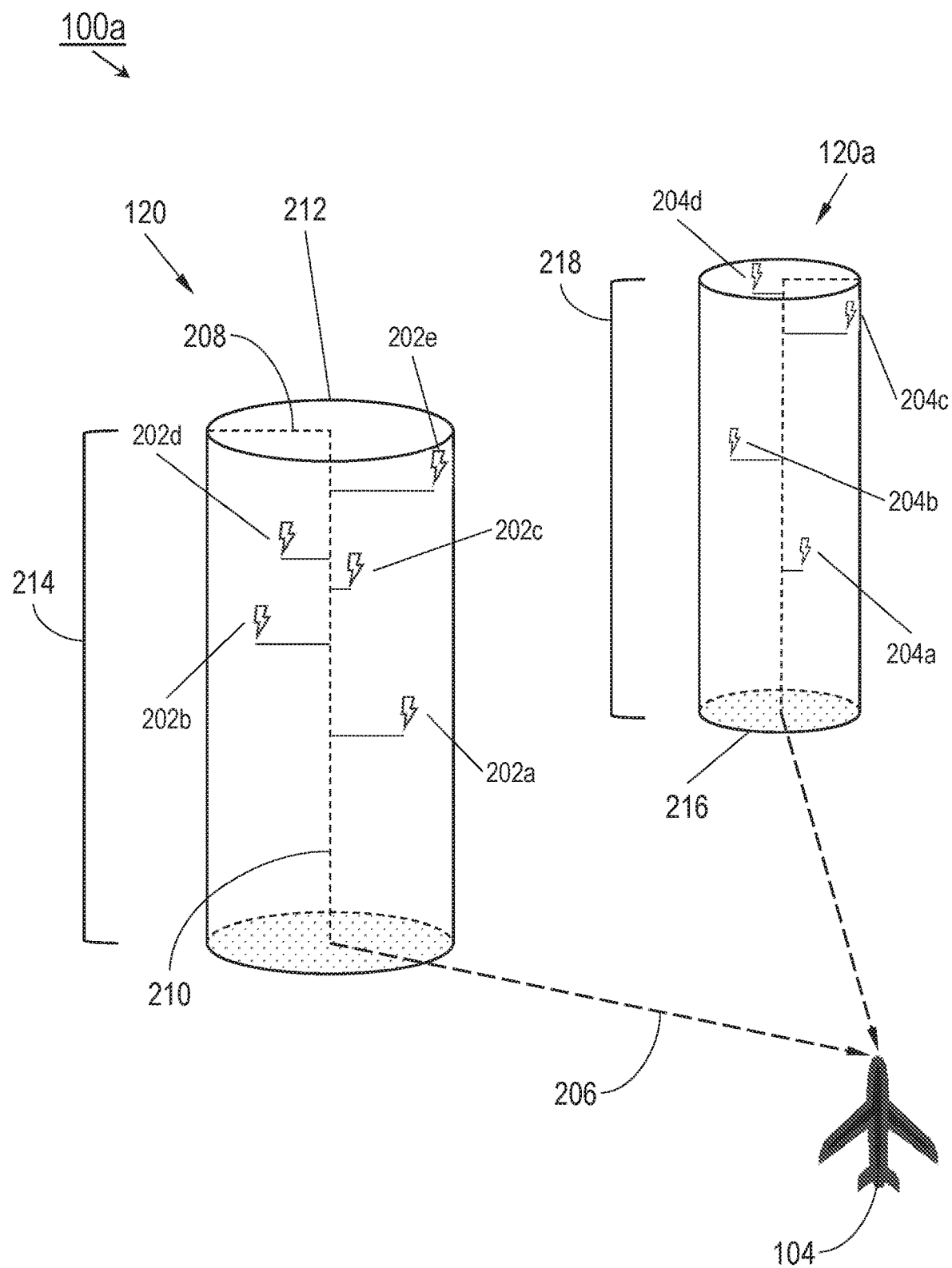
FIG. 2 is a diagrammatic illustration of flight deck effects (FDE) displayed via the PFD of FIG. 1.

Referring to FIG. 2, the SVS display 100a may be implemented and may function similarly to the SVS display 100 of FIG. 1, except that the SVS display 100a may generate an FDE 120, 120a based on the detection by onboard lightning sensors of a sufficient quantity of individual lightning strikes 202a-e, 204a-d (e.g., exceeding a predetermined strike threshold) within a volume of airspace within a predetermined time window (e.g., 1 minute).

In embodiments, the lightning sensors aboard the aircraft 104 may continually detect individual lightning strikes 202a-e, 204a-d, each individual lightning strike occurring at a given time and at a particular bearing to and distance from (206) the aircraft 104. For example, if, within the time window, a sufficient quantity of lightning strikes (202a-e) are detected within a predetermined radius 208 of an axis 210 (e.g., an axis extending vertically above the ground), the SVS display 100a may include a cylindrical volume 212 having as its longitudinal axis the axis 210 and including within its radius 208 and height 214 (e.g., maximum altitude) the proximate lightning strikes 202a-e. In some embodiments, the radii 208 or heights 214, 218 of the volumes 210, 216 corresponding to each FDE 120, 120a may be determined by cross-referencing real-time lightning data with other available weather and atmospheric data, e.g., local area forecasts or weather radar (WXR) scans.

In embodiments, the FDE 120, 120a may be of any appropriate size depending on the desired parameters (e.g., number of lightning strikes, time window). For example, the volume 216 of the FDE 120a may reflect a lower maximum altitude 218 than the height 214 of the volume 210 corresponding to the FDE 120; the FDE 120a may be associated with a more closely concentrated quantity of lightning strikes 204a-d. In embodiments, the FDEs 120, 120a may decay or disappear from the SVS display 100a as described above. In some embodiments, as the time elapses after each individual lightning strike, the quantity of lightning strikes 202a-e, 204a-d within the volumes 208, 210 during, e.g., the last minute (or other predetermined time window) may decrease and deceed the strike threshold, such that the corresponding FDE 120, 120a disappears from the SVS display 100a. While each individual lightning strike 202a-e, 204a-d may contribute to the definition and creation of an FDE 120, 120a, the FDEs displayed by the SVS display 100a may not include each individual lightning strike.

Figure 3:
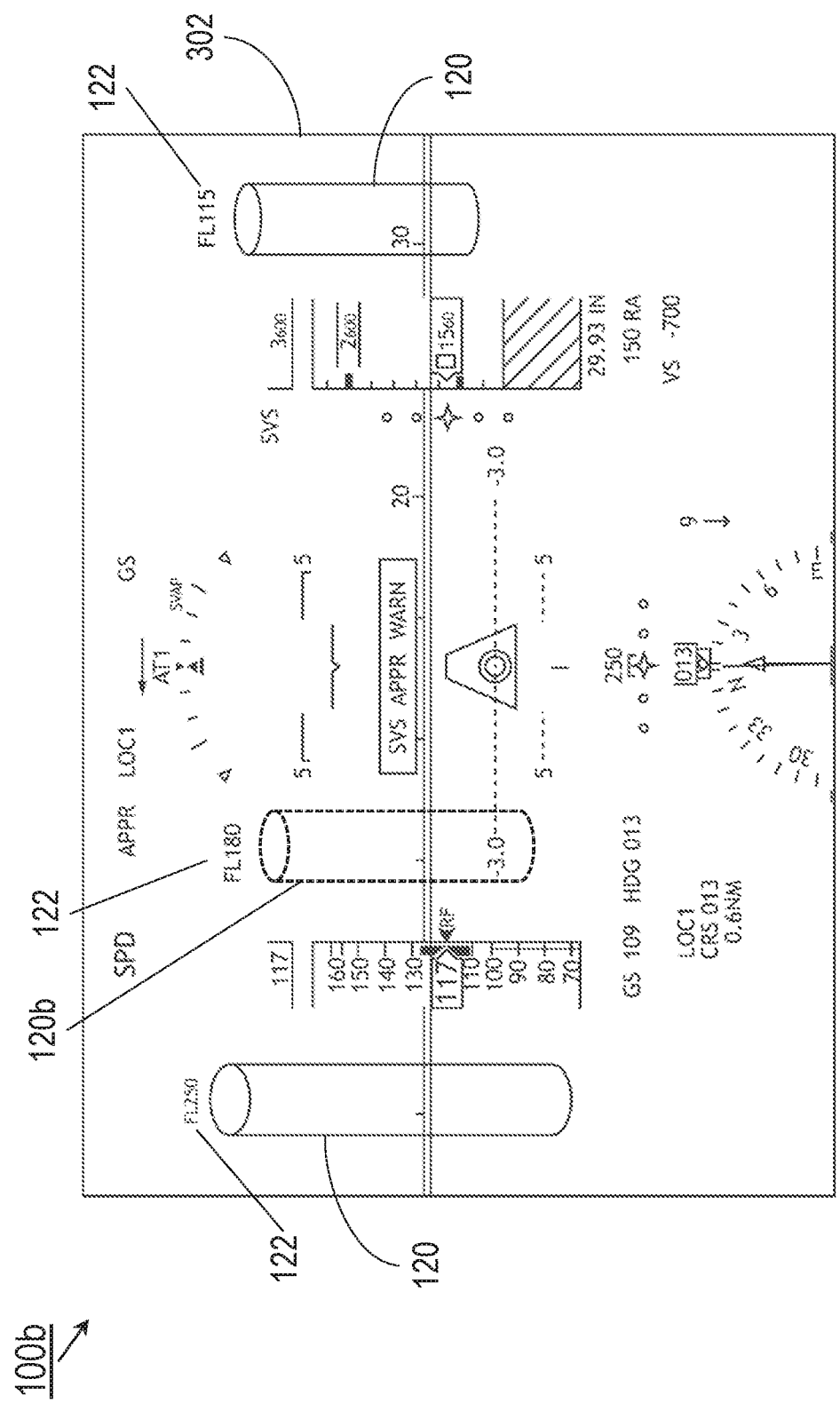
FIG. 3 is a forward illustration of a heads-up display (HUD) in accordance with example embodiments of this disclosure.

Referring to FIG. 3, the SVS display 100b may be implemented and may function similarly to the SVS displays 100, 100a of FIGS. 1 and 2, except that the SVS display 100b (incorporating FDEs 120, decaying FDE 120b and altitude markers 122) may be displayed by a heads-up display 302 (HUD), a helmet-mounted display (HMD) or some other version of head-worn display (HWD) worn by the user.

Figure 4:
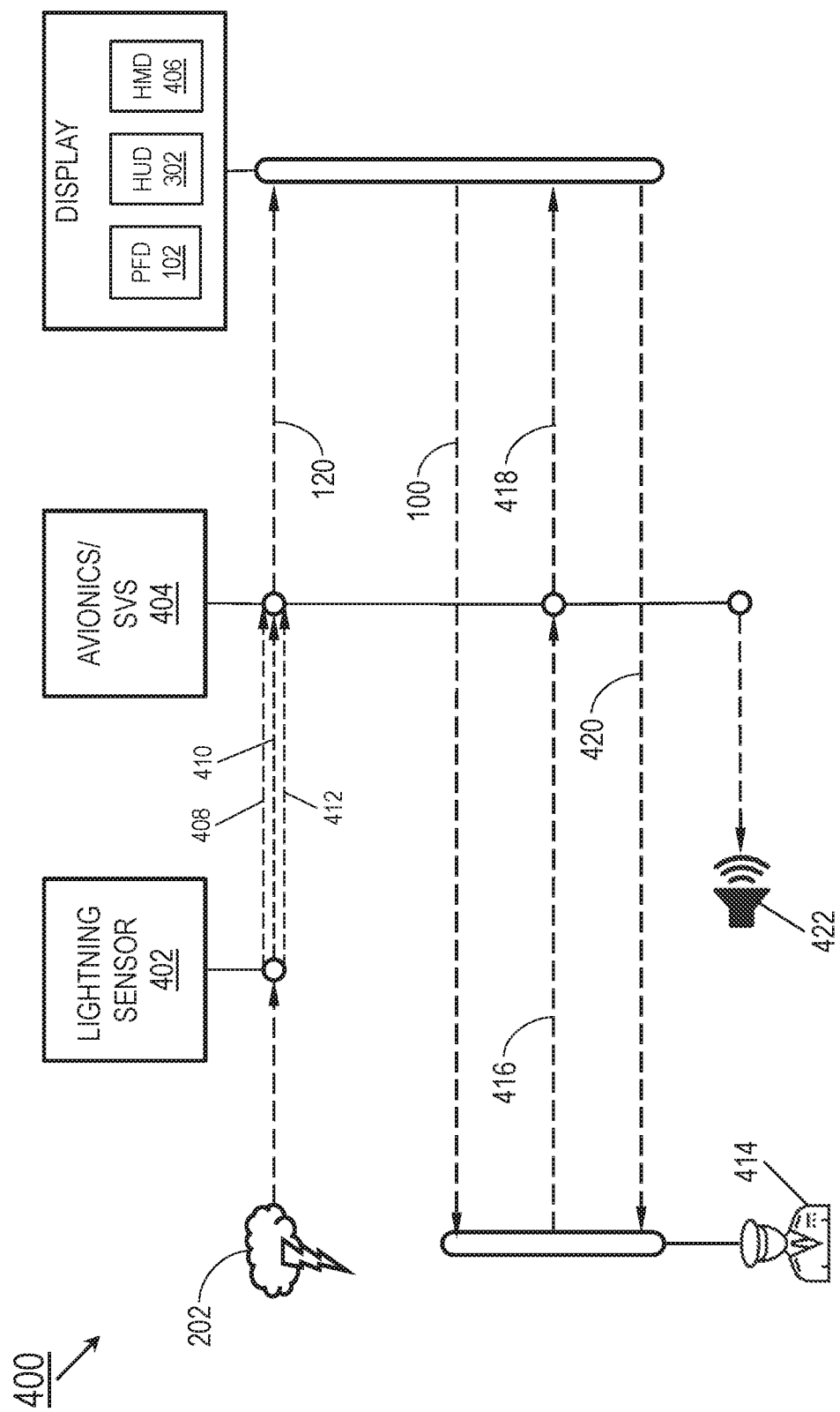
FIG. 4 is a block diagram illustrating a real-time lightning detection system incorporating the PFD of FIG. 1 and the HUD of FIG. 3.

Referring to FIG. 4, a real-time lightning detection system 400 is disclosed. The real-time lightning detection system 400 may include lightning detection sensors 402 and avionics processors 404 and may incorporate one or more of a PFD 102, a HUD 302, or a helmet-mounted display 406 (HMD).

In embodiments, the real-time lightning detection system 400 may detect and track individual lightning strikes 202 as they happen. For example, for each individual lightning strike 202, the lightning detection sensors 402 may track the time 408 of the lightning strike as well as a bearing 410 from the strike to the aircraft (104, FIG. 1) and a distance 412 between the strike and the aircraft. The avionics processors 404 may include processors for the synthetic vision system (SVS), which identify clusters of proximate lightning strikes 202 based on the real-time lightning data (408, 410, 412) and generate FDEs 120 based on, e.g., a sufficient quantity of proximate or clustered lightning strikes within a time window. The avionics processors 404 may include graphics processors capable of incorporating the FDEs 120 directly into the SVS display 100) or, in some embodiments, superimposing the FDEs onto the SVS display fed to the PFD 102, the HUD 302, or the HMD 406 for display to the pilot 414, crew, or other user/s.

In embodiments, having incorporated FDEs 120 into the SVS display 100 at the appropriate bearing to and distance from the aircraft 104, the avionics processors 404 may continue to track the heading (106, FIG. 1) of the aircraft relative to the locations of the FDEs. For example, the pilot 414 or flight crew may take into consideration the bearing and distance of each FDE 120 relative to the aircraft 104 as well as other weather and atmospheric data (e.g., a 2d plot of individual lightning strikes 202) in determining whether to modify the flight plan (416) of the aircraft to avoid airspace corresponding to the FDEs and the associated lightning strikes (e.g., via initiating a reroute), the modified flight plan sent to the displays (418) for display to the crew (420) for review and possible execution. In some embodiments, the avionics processors 404 may activate an aural alert 422 to warn the flight crew if the aircraft 104 continues on a course into, or proximate to, areas of extreme weather or frequent lightning strikes 202.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

I claim:

1. A synthetic vision system (SVS), comprising:
at least one avionics processor in communication with one or more lightning sensors configured to sense real-time lightning data corresponding to at least one lightning strike proximate to an aircraft, the real-time lightning data including at least:
a time of the lightning strike;
a first bearing from the aircraft to the lightning strike; and
a first distance between the aircraft and the lightning strike;
the avionics processor configured to generate at least one flight deck effect (FDE) corresponding to a volume enclosing a quantity of the proximate lightning strikes within a predetermined time window, the quantity exceeding a strike threshold, the FDE including at least a second bearing from the aircraft to the volume and a second distance between the aircraft and the volume; and
a display system installable aboard the aircraft and couplable to the avionics processor, the display system configured to:
generate at least one status display based on one or more of a current position of the aircraft and an instrument status of the aircraft; and
display the at least one FDE relative to the status display to at least one user.

2. The SVS of claim 1, wherein the at least one avionics processor includes a graphics processor configured to incorporate the at least one FDE into the status display.

3. The SVS of claim 1, wherein the display system includes a primary flight display (PFD) of the aircraft.

4. The SVS of claim 1, wherein the display system includes at least one of a heads-up display (HUD) or a helmet-mounted display (HMD) worn by the user.

5. The SVS of claim 1, wherein the at least one FDE includes an altitude marker corresponding to a maximum altitude of the volume.

6. The SVS of claim 1, further comprising:
at least one speaker configured to transmit an aural alert to the user, the aural alert based on at least one of the second bearing or the second distance.

7. A real-time lightning detection system, comprising:
one or more aircraft-based lightning sensors configured to:
detect at least one lightning strike proximate to an aircraft; and
generate real-time lightning data corresponding to the at least one lightning strike, the real-time lightning data including at least a first bearing from the aircraft, a first distance between the aircraft and the lightning strike, and a time of the lightning strike;
at least one avionics processor in communication with the one or more lightning sensors and configured to generate at least one flight deck effect (FDE) based on the real-time lightning data, the FDE corresponding to a volume enclosing a quantity of selected lightning strikes exceeding a strike threshold within a time window, the FDE including at least a second bearing from the aircraft to the volume and a second distance between the aircraft and the volume; and
at least one display system in communication with the avionics processor, the display system configured to:

generate at least one status display based on one or more of a current position of the aircraft and an instrument status of the aircraft; and display to at least one user the at least one FDE relative to the status display.

8. The real-time lightning detection system of claim 7, wherein the at least one avionics processor includes a graphics processor configured to incorporate the at least one FDE into the status display.

9. The real-time lightning detection system of claim 7, wherein the display system includes a primary flight display (PFD) of the aircraft.

10. The real-time lightning detection system of claim 7, wherein the display system includes at least one of a heads-up display (HUD) or a helmet-mounted display (HMD) worn by the user.

11. The real-time lightning detection system of claim 7, wherein the at least one FDE includes an altitude marker corresponding to a maximum altitude of the volume.

12. The real-time lightning detection system of claim 7, further comprising:

at least one speaker configured to transmit an aural alert to the user, the aural alert based on at least one of the second bearing or the second distance.

* * * * *